(12) United States Patent
Mizuno et al.

(10) Patent No.: US 6,522,378 B1
(45) Date of Patent: Feb. 18, 2003

(54) LIQUID CRYSTAL DISPLAY AND MANUFACTURE THEREFORE

(75) Inventors: Hiroaki Mizuno, Ishikawa (JP); Masaki Nishinaka, Ishikawa (JP); Shingo Fujita, Ishikawa (JP); Tetsu Ogawa, Ishikawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/647,014

(22) PCT Filed: Mar. 24, 1999

(86) PCT No.: PCT/JP99/01510
§ 371 (c)(1),
(2), (4) Date: Nov. 27, 2000

(87) PCT Pub. No.: WO99/50708
PCT Pub. Date: Oct. 7, 1999

(30) Foreign Application Priority Data

Mar. 26, 1998  (JP) .............................. 10-078171

(51) Int. Cl.[7] ...................... G02F 1/1343; G02F 1/1345
(52) U.S. Cl. ...................................... 349/139; 349/152
(58) Field of Search .................................. 349/149, 139, 349/151, 152, 187

(56) References Cited

FOREIGN PATENT DOCUMENTS

| EP | 0 376 165 | 7/1990 |
|---|---|---|
| EP | 0 629 895 | 12/1994 |
| EP | 0 913 719 | 5/1999 |
| JP | 3-121413 | 5/1991 |
| JP | 3-289626 | 12/1991 |
| JP | 5-315328 | 11/1993 |
| JP | 7-134300 | 5/1995 |
| JP | 8-179252 | 7/1996 |
| JP | 09-074253 | 7/1997 |
| JP | 9-230806 | 9/1997 |
| JP | 09318962 | 12/1997 |

*Primary Examiner*—William L. Sikes
*Assistant Examiner*—P. R. Akkapeddi
(74) *Attorney, Agent, or Firm*—RatnerPrestia

(57) ABSTRACT

An electrode width of intermediate connection wiring which connects terminal electrode and common electrode is made narrower than an electrode width of terminal electrode at forming an electrode pattern on one of substrates configuring a liquid crystal display device. This enables the prevention of detrimental effect of cutting and polishing the periphery of a liquid crystal cell onto the terminal electrode. A laser irradiation process required for removing the common electrode is eliminated, and thus manufacturing cost may be reduced.

16 Claims, 8 Drawing Sheets

LIQUID CRYSTAL DISPLAY AND MANUFACTURE THEREFORE

FIELD OF THE INVENTION

The present invention relates to liquid crystal display devices and method of manufacturing the same.

BACKGROUND OF THE INVENTION

This application is a U.S. national phase application of PCT International application PCT/JP99/01510.

The manufacturing of liquid crystal display devices includes a series of processes of configuring a liquid crystal cell using substrate 1 on which an electrode pattern as shown in FIGS. 6 and 8 is formed, cutting and removing the periphery of this liquid crystal cell at cut position 2, and polishing the cut section to smooth the rough surface.

Terminal electrode 3 is formed near the cut position of substrate 1 for connecting to an external circuit. A reference numeral 6 in FIGS. 6 and 8 shows a display electrode.

In case of an active matrix array substrate having a switching device such as a thin film transistor inside a liquid crystal cell, common electrode pattern 4 for short-circuiting terminal electrode 3 is provided on substrate 1 for preventing destruction of any switching elements by static electricity generated during the manufacturing processes of an array substrate and liquid crystal cell. Common electrode pattern 4 is then removed after cutting the periphery of liquid crystal cell.

Even in the case of a liquid crystal cell not possessing a switching device, a common electrode pattern for short-circuiting the terminal electrode is also provided in order to prevent degradation of an aligning film by static electricity. The common electrode pattern is then removed after cutting the periphery of the liquid crystal cell.

These electrodes are conventionally formed with an ITO (indium tin oxide or tin oxide solid solution). In this case, as shown in FIGS. 5(a) and 6, common electrode pattern 4 is automatically removed when cutting the substrate by providing common electrode pattern 4 outside cut position 2.

However, recent demands for larger displays require a lower resistance electrode. For example, the Japanese Patent Laid-open Publication No. H9-230806 proposes the use of an Ag metal electrode.

In addition, for increasing the brightness of a reflective liquid crystal display device as a mobile display apparatus, provision of a reflector inside the liquid crystal cell is proposed by forming a metal electrode functioning both as a reflector and electrode on a bottom substrate. This configuration uses a signal polarizer or no polarizer. As for materials of the metal electrode, Al and Ag materials are receiving attention because they have low wiring resistance and high reflectance (e.g., the Japanese Patent Laid-open Publication Nos. H7-134300 and H8-179252).

However, the use of the metal electrode as terminal electrode 3, in particular Al and Ag materials which are not hard metals, may short-circuit the adjacent terminal electrodes at the cut section of the substrate during polishing due to the ductility of the terminal electrode material, as shown by a reference numeral 7 in FIG. 5(b), where adjacent terminal electrodes are intended to be electrically isolated as shown in FIG. 5(a), as a result of the cutting and polishing processes of the liquid crystal cell.

To avoid the above short-circuiting, common electrode pattern 4 is provided inside cut position 2 of the substrate, as shown in FIG. 8, and an additional process of separating terminal electrodes by removing common electrode pattern 4 (an area equivalent to laser irradiation width L) by laser irradiation, as shown in FIG. 7, is required after cutting the periphery of the liquid crystal cell.

The present invention aims to offer a liquid crystal display and a method of manufacturing the same which eliminate an additional process such as laser irradiation even when an electrode pattern is formed using a ductile metal material.

SUMMARY OF THE INVENTION

The liquid crystal display of the present invention comprises a first substrate; a terminal electrode made of metal provided inside the first substrate; an intermediate connection wiring made of metal whose one end is connected to the terminal electrode and the other end reaches to a substrate end; a second substrate; and a liquid crystal layer interposed between the first and second substrates. The width of the intermediate connection wiring at the end of the first substrate is set to be narrower than the electrode width of the terminal electrode.

A method of manufacturing the liquid crystal display of the present invention includes the steps of forming two or more terminal electrodes made of metal on the first substrate inside a cut position for cutting and removing the periphery of the substrate at a later process;

forming the common electrode wiring outside the cut position;

forming the intermediate connection wiring made of metal for connecting each terminal electrode to common electrode wiring, whose width is narrower than that of the terminal electrodes at the cut position;

interposing liquid crystal between the first and second substrates; and cutting and removing the periphery of the substrate at the cut position of the first substrate.

The present invention thus provides a liquid crystal display which does not cause short-circuiting between adjacent terminal electrodes even when the substrate end is polished after cutting the substrate on which the electrode pattern made of ductile metal is formed.

DESCRIPTION OF THE PREFERRED EMBODIMENT

A preferred embodiment of the present invention is described below with reference to FIGS. 1 to 4.

Figure 1:
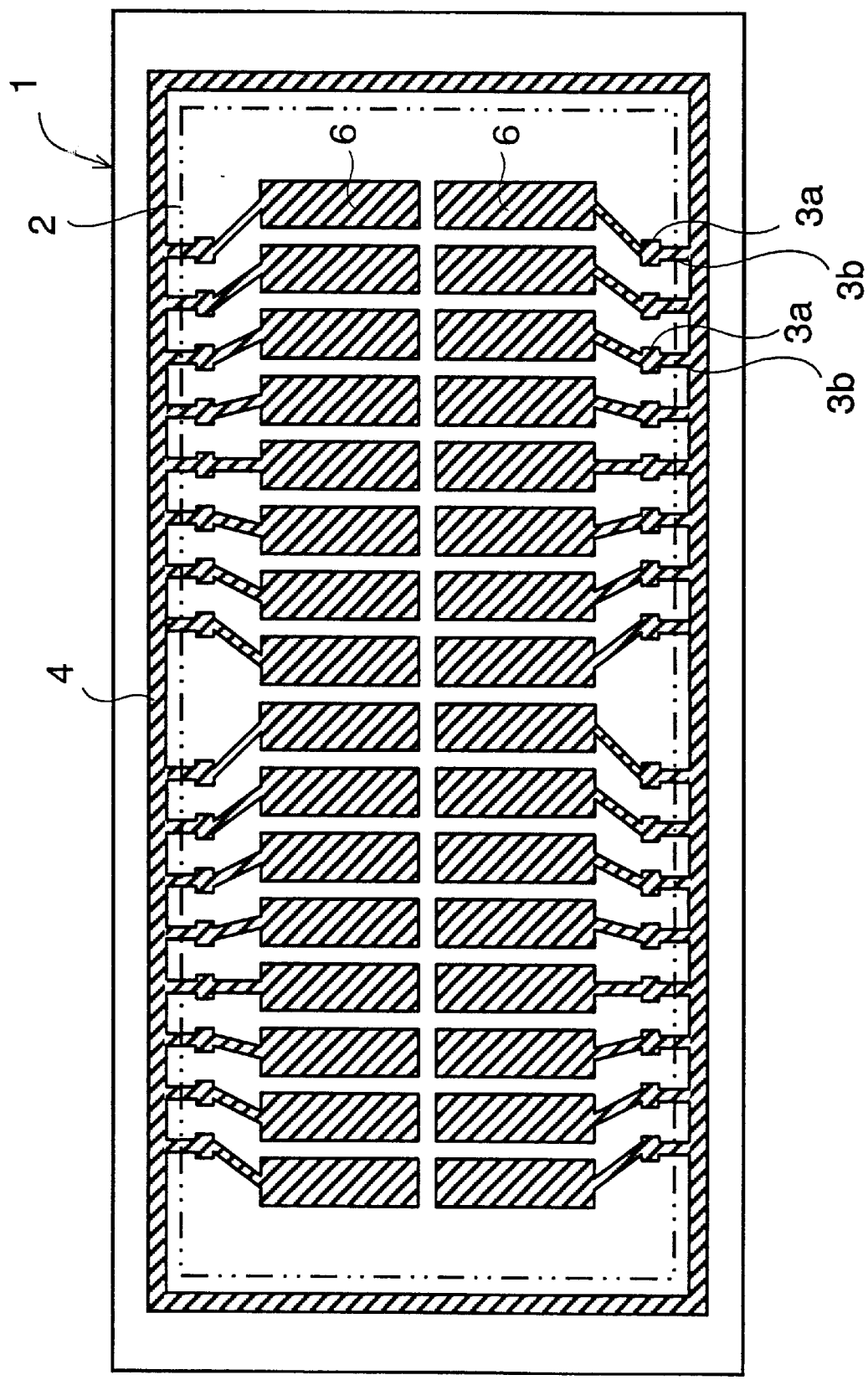
FIG. 1 is a plan view of a substrate in accordance with a preferred embodiment of the present invention.
Figure 2:
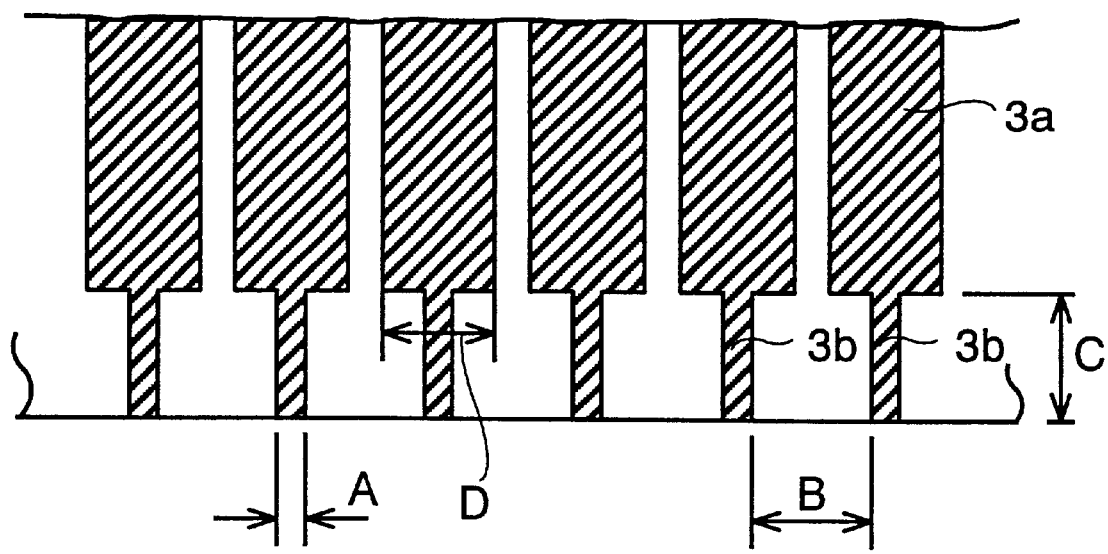
FIG. 2 is a plan view around a terminal electrode of a substrate in accordance with the preferred embodiment of the present invention.
Figure 3:
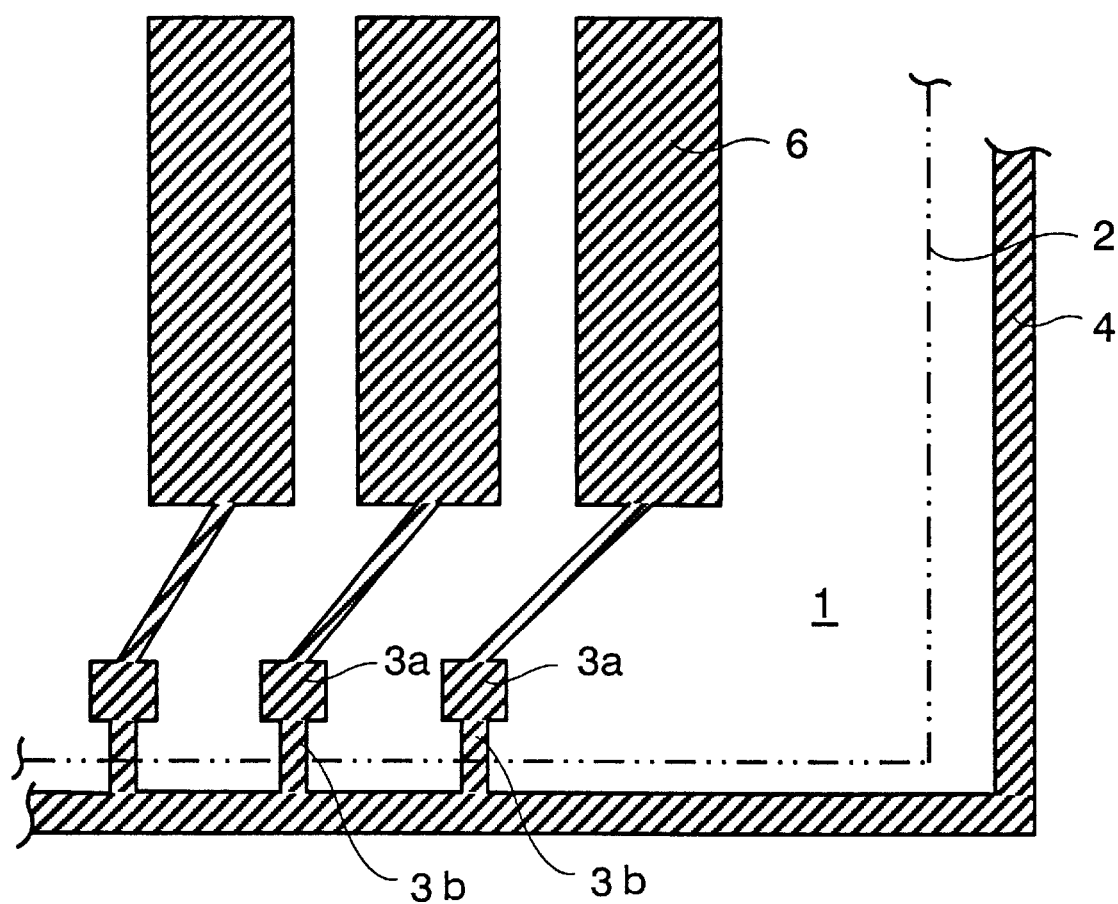
FIG. 3 is a magnified view of a key part in FIG. 1.

In FIG. 1, display electrode 6, terminal electrode 3a connected to this display electrode 6 and disposed inside cut position 2 of a substrate, common electrode 4 prepared for static electricity disposed outside cut position 2, and intermediate connection wiring 3b for connecting terminal electrode 3a and common electrode 4, as shown in FIGS. 2 and 3, are formed on substrate 1. A peripheral portion of the substrate outside cut position 2 is cut and removed at a later process.

FIG. 2 is a magnified view around the terminal electrode. As shown in FIG. 2, line width A of intermediate connection wiring 3b is set to be narrower than electrode width D of terminal electrode 3a.

Figure 4:
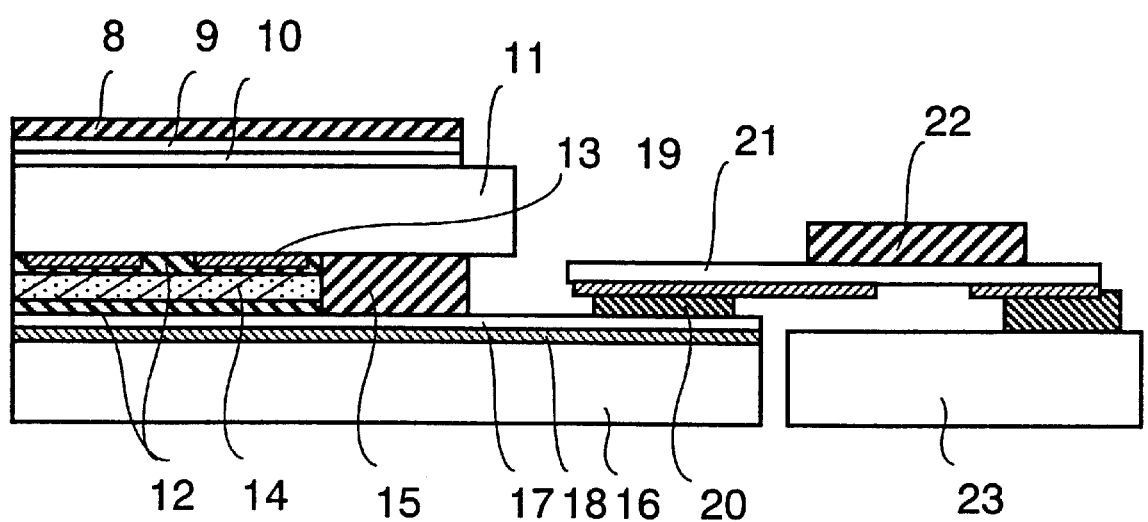
FIG. 4 is a sectional view of a reflective liquid crystal display in accordance with the preferred embodiment of the present invention.
Figure 5A:
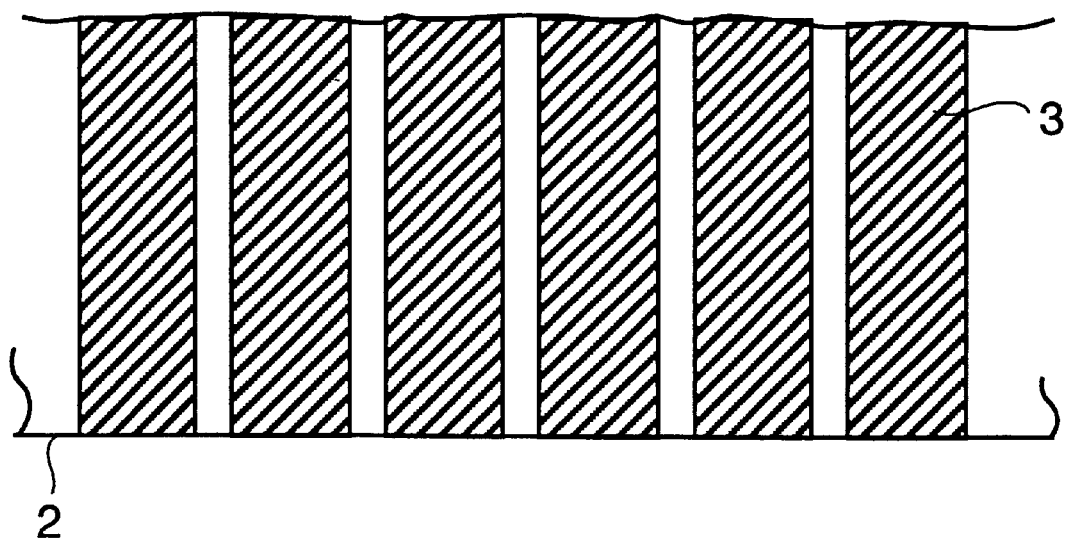
FIGS. 5a and 5b are plan views around the terminal electrode in a conventional manufacturing of an electrode substrate.
Figure 5B:
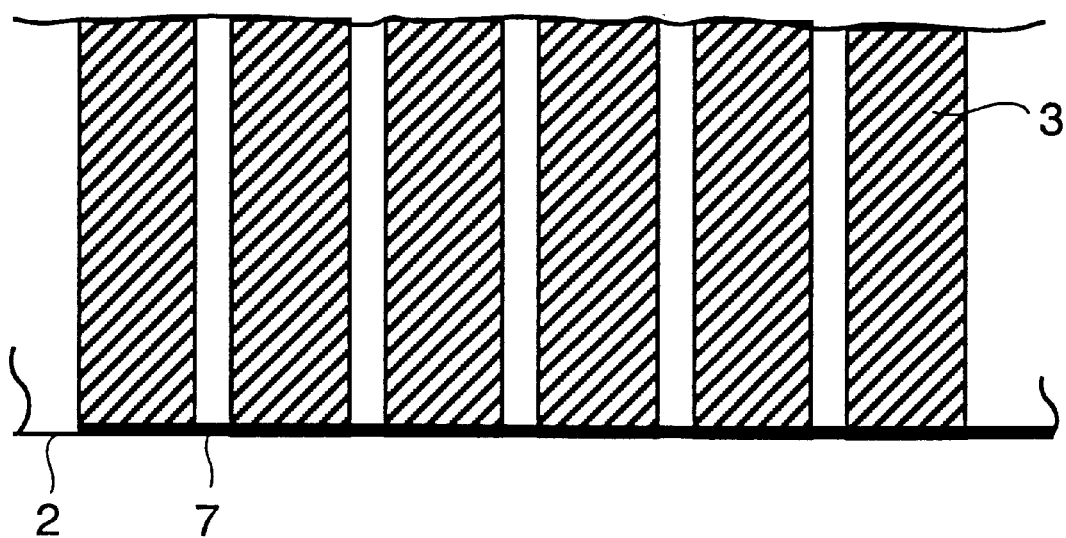
Figure 6:
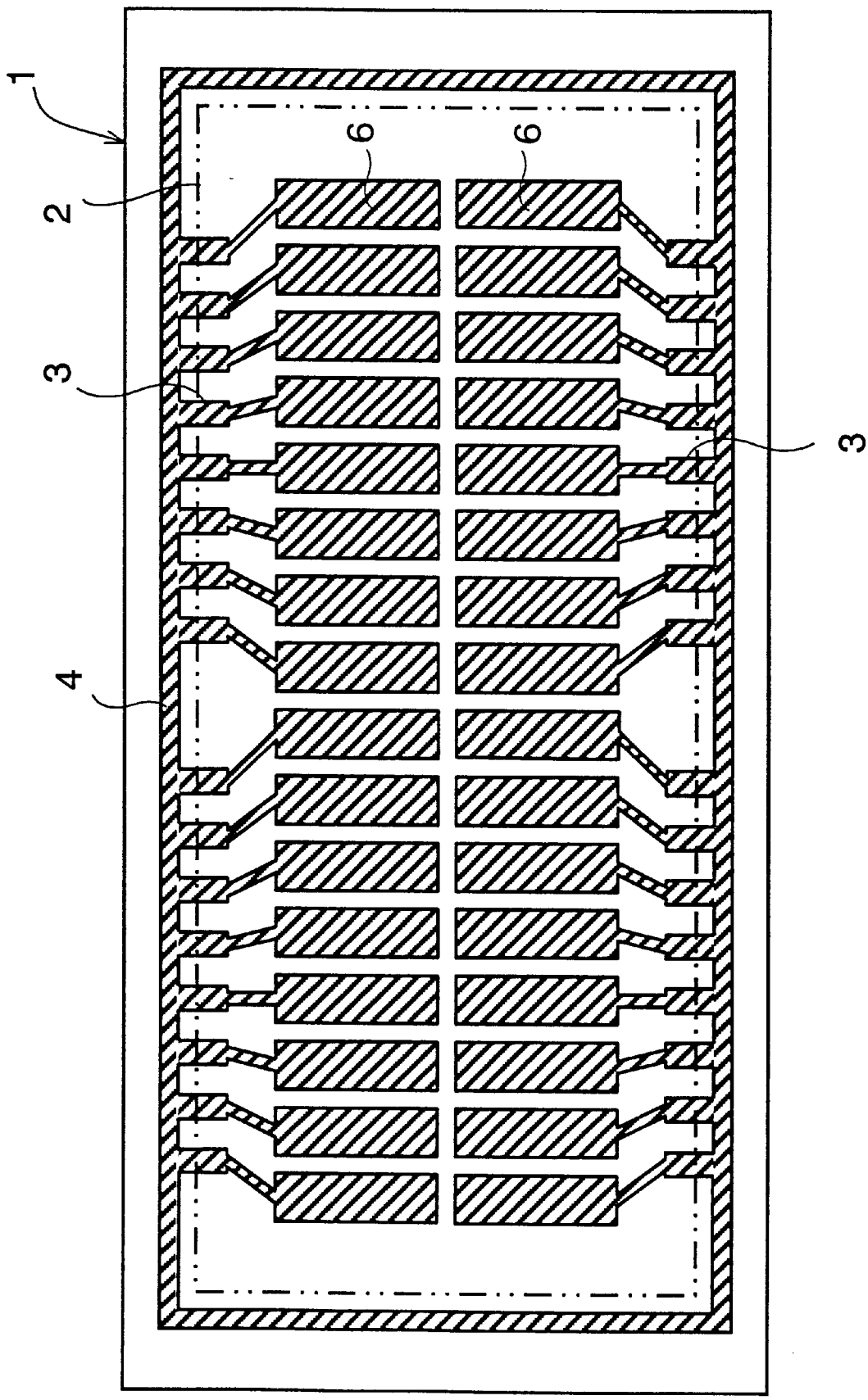
FIG. 6 is a plan view of an example of the conventional electrode substrate.
Figure 7:
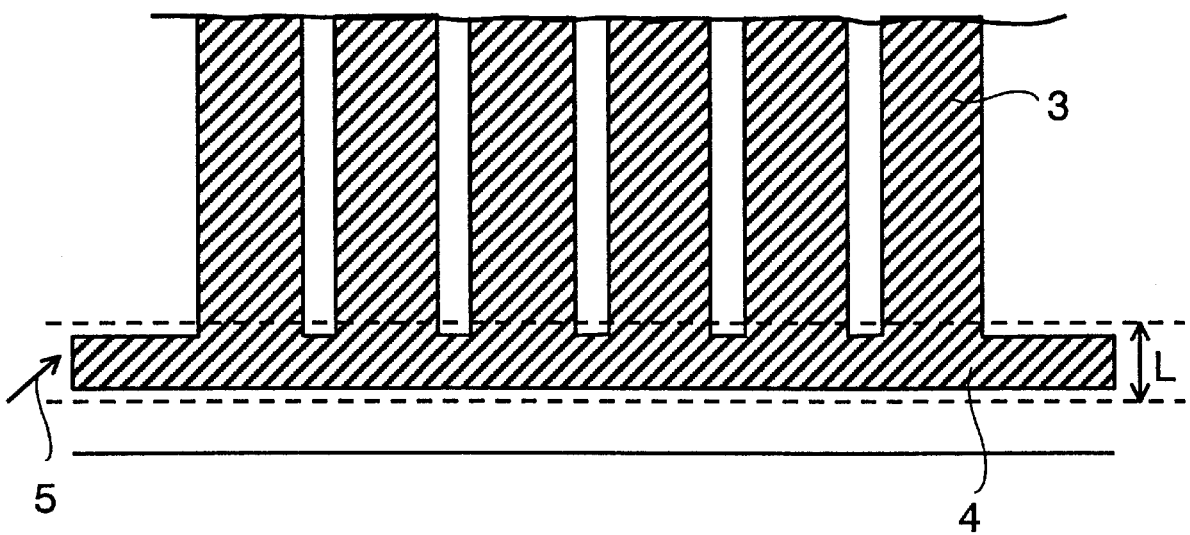
FIG. 7. is a plan view around the terminal electrode for illustrating a conventional method of manufacturing the electrode substrate.
Figure 8:
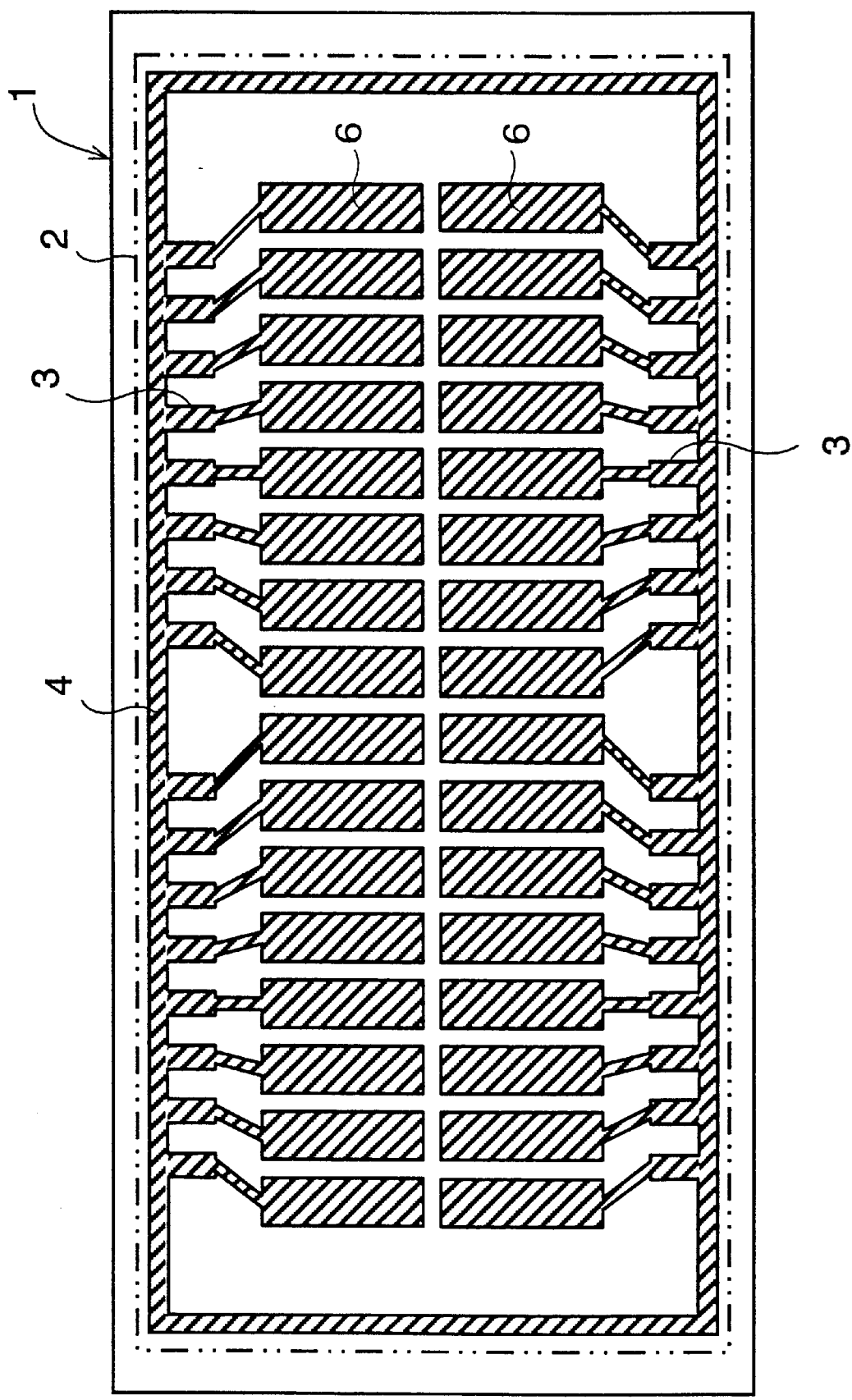
FIG. 8 is a plan view of another example of the conventional electrode substrate.

FIG. 4 shows a reflective liquid crystal display manufactured using a substrate on which electrode wiring is formed as described above. In FIG. 4, a display electrode also functions as a reflective electrode.

Manufacturing of the reflective liquid crystal display of the present invention is detailed next in accordance with the preferred embodiment.

First Exemplary Embodiment

First, 500 Å of Ti layer 18 and 2000 Å of Al layer 17 are sequentially laminated on the surface of bottom substrate 16 by DC magnetron sputtering using a Ti target and Al alloy target. An electrode pattern as shown in FIG. 2 is formed by these two layers to create a specular reflection type metal reflective electrode. A switching device such as a TFT is not formed on this substrate.

Then, a 5 wt % N-methyl-2-pyrolidinone solution of polyimide is printed on the surface of bottom substrate 16 where the above electrodes are formed and top substrate 11 where ITO transparent electrode 13 is formed. After curing the substrates at 200° C., aligning layer 12 is formed by rotational rubbing using a rayon cloth to achieve 250° twisted STN mode liquid crystal display.

Thermosetting sealing resin 15 in which a 5.5 $\mu$m diameter glass fiber mixed at 1.0 wt % is printed at the peripheral sealing area of top substrate 11, and 5.0 $\mu$m diameter resin beads are scattered on the bottom substrate 16 at a ratio of 200 particles/mm$^2$. Top substrate 11 and bottom substrate 16 are then adhered, and sealing resin is cured at 150° for completing the liquid crystal cell.

After cutting and removing the periphery of the bottom substrate of the liquid crystal cell at cut position 2 in FIG. 1, the cut section is polished for smoothening. Liquid crystal 14 which is made of ester type nematic liquid crystal with refractive-index anisotropy $\Delta$n of 0.16 mixed with a predetermined amount of chiral liquid crystal is vacuum filled into the liquid crystal cell. The inlet is sealed with UV-curing resin, and cured by UV irradiation.

Scattering film 10 is then laminated on top substrate 11 of the liquid crystal cell as formed above. Scattering film 10 used in the present invention is a forward scattering film (trade name: Lumisty by Sumitomo Chemical Co. Ltd.), and a film having 0° and 50° scattering directions measured from the normal film direction are laminated onto top substrate 11. Polymer film 9 made of polycarbonate resin is then adhered onto this scattering film 10. Polymer film 9 consists of two polymer films having different delay phase axes. One polymer film on the liquid crystal cell side has 0.3 $\mu$m retardation, and its delay phase axis with respect to the orientation of top substrate 11 is 90°. The other polymer film on top has 0.5 $\mu$m retardation, and its delay phase axis with respect to the orientation of top substrate 11 is 45°. Then, a neutral gray polarizer 8 (SQ-1852AP by Sumitomo Chemical Co. Ltd.) with antiglare (AG) treatment is adhered on to polymer film 9 so as to match its absorption axis to the delay phase axis of the polymer film on the liquid crystal cell side.

A driving circuit for the liquid crystal cell consists of printed circuit board 23 on which electronic components are mounted and TAB tape carrier on which LSI chip 22 is mounted is connected to terminal electrode 17 of the liquid crystal cell using anisotropic conductive adhesive 20.

An exposed part of the terminal electrode between the electrode where the tape carrier is connected and sealing resin 15 is covered with acrylic resin 19 (TF 1141 by Hitachi Chemical Industry).

The above configuration provides a reflective liquid crystal display device for achromatic black display with low reflectance, achromatic white display with high reflectance, and achromatic color changes from black to white by simple matrix driving with the 1/240 duty ratio.

The influence of cutting and polishing on line width A, interval B, and length C in FIG. 2, and the degree of damage caused by roughness of the cut section are examined for the above reflective liquid crystal display. In addition, short-circuiting of adjacent terminal electrodes due to ductility of metal by polishing the cut section is examined.

Specimens with fixed electrode width D of 45 $\mu$m in FIG. 2, line width A of 40 $\mu$m, 30 $\mu$m, 20 $\mu$m, or 10 $\mu$m; interval B of 30 $\mu$m, 40 $\mu$m, 50 $\mu$m, or 60 $\mu$m; and length C remaining after cuts of 100 $\mu$m, 200 $\mu$m, 300 $\mu$m, or 400 $\mu$m are prepared. The influence of cutting and polishing is examined for these specimens.

Results indicated that with respect to the length C, cutting and polishing in the specimen when length C is 100 $\mu$m cause damage to terminal electrode 3a because minute roughness at the substrate cut end penetrates to about 100 $\mu$m, and the surface needs to be made smooth by polishing to about 100 $\mu$m inside the substrate cut position. Specimens with 200 $\mu$m, 300 $\mu$m, and 400 $\mu$m for length C do not show any damage to terminal electrode 3a as a result of cutting and polishing.

Consequently, a configuration that avoids the damage up to terminal electrode 3a by cutting and polishing is achievable by setting the length C to 200 $\mu$m or longer.

Elongation of the metal at the cut section of the substrate by polishing causes short-circuiting between adjacent intermediate connection wirings in specimens with 30 $\mu$m, 40 $\mu$m, 50 $\mu$m, and 60 $\mu$m for electrode interval B when line width A is 40 $\mu$m or 30 $\mu$m. In case of specimen with line width A of 20 $\mu$m, the metal partially elongated at the cut section as a result of polishing when the electrode interval B is 30 $\mu$m. However, this partial elongation does not cause short-circuiting between adjacent intermediate connection wirings. No elongation of metal or short-circuiting between adjacent intermediate connection wirings occur at the cut section as a result of polishing in specimens with electrode interval B of 40 $\mu$m, 50 $\mu$m, or 60 $\mu$m. When electrode width A is 10 $\mu$m, no elongation of the metal or short-circuiting between adjacent intermediate connection wirings occur in specimens with electrode interval B of 30 $\mu$m, 40 $\mu$m, 50 $\mu$m, or 60 $\mu$m.

Consequently, a configuration that avoids short-circuiting between adjacent intermediate connection wirings due to elongation of metal at the substrate cut section by polishing is achievable by setting the line width of the intermediate connection wiring at the substrate cut section to 20 $\mu$m or below. Even better results are achieved when electrode interval B between adjacent electrodes is 40 $\mu$m or wider at the liquid cell cut section.

The same results are obtained when Al alloy layer 17 is thickened to 5000 Å.

The above embodiment refers to an example of a reflective liquid crystal display device which has display electrodes made of a metal electrode. However, the above results are applicable as long as the terminal electrode and intermediate connection wiring are made of the metal electrode. Accordingly, the present invention is also applicable to a transmissive liquid crystal display device whose display electrode is configured with the ITO.

The preferred embodiment also employs a substrate on which a switching device such as a TFT is not formed. However, the present invention is also naturally applicable to a substrate on which the switching device is formed, such as an active matrix array substrate, as long as the terminal electrode and intermediate connection wiring are made of the metal electrode. Application of the present invention improves the display quality.

The Al alloy used in the preferred embodiment is one of metals having the highest ductility, and thus cutting and polishing may be implemented more safely with other metals. Thus, the present invention is also applicable to a layer containing Ag or Ag alloys, for example, which are being increasingly used as reflective electrodes because of their high reflectance.

Electrode width D of the terminal electrode in the above description is set to 45 µm. However, the electrode width is not limited as long as the width required for connecting electronic components for driving liquid crystal cells to the terminal electrode of liquid crystal cell is achieved.

The preferred embodiment shown in FIG. 4 uses a substrate with the configuration shown in FIG. 3 only for bottom substrate 16. It is apparent that only top substrate 11 may use the processed substrate shown in FIG. 3 configured with the metal electrode from the terminal electrode to the substrate cut section. Or, both bottom substrate 16 and top substrate 11 may have a configuration of the present invention in which the metal electrode is used for the terminal electrode and intermediate connection wiring, and these two substrates may be adhered for creating the liquid crystal cell.

As described above, the present invention prevents any damage to the terminal electrode due to the outer roughness of the substrate cut section even when the liquid crystal cell substrate is cut and polished at the cut position, and eliminates short-circuiting between adjacent electrodes caused by elongation of metal at the cut section due to polishing, by making the line width of the intermediate connection wiring connecting the terminal electrode and common electrode narrower than that of the terminal electrode.

Industrial Applicability

The present invention provides a liquid crystal display device which eliminates the occurrence of short-circuiting between adjacent terminal electrodes even when the cut end of the substrate, on which the electrode pattern made of a metallic material having high conductivity and ductility is formed, is polished.

Consequently, the laser irradiation process which is conventionally required for removing the common electrode can be omitted, reducing the manufacturing cost of the liquid crystal display device and thus contributing to increased use of low-power consuming reflective liquid crystal display devices and large high definition liquid crystal display devices.

What is claimed is:

1. A liquid crystal display comprising:
a first substrate;
a terminal electrode made of metal, said terminal electrode being disposed on a surface inside said first substrate;
an intermediate connection wiring made of metal, one end of said intermediate connection wiring being connected to said terminal electrode and the other end of said intermediate connection wiring reaching an end of said first substrate;
a second substrate; and
a liquid crystal layer interposed between said first substrate and said second substrate;
wherein a line width of said intermediate connection wiring at the end of said first substrate is set to be narrower than an electrode width of said terminal electrode, and
wherein the line width of said intermediate connection wiring at the end of said first substrate is set to be not greater than 20 µm, and an interval between said adjacent intermediate connection wirings is set to be not less than 40 µm.

2. A liquid crystal display comprising:
a first substrate;
a terminal electrode made of metal, said terminal electrode being disposed on a surface inside said first substrate;
an intermediate connection wiring made of metal, one end of said intermediate connection wiring being connected to said terminal electrode and the other end of said intermediate connection wiring reaching an end of said first substrate;
a second substrate; and
a liquid crystal layer interposed between said first substrate and said second substrate;
wherein a line width of said intermediate connection wiring at the end of said first substrate is set to be narrower than an electrode width of said terminal electrode
wherein said terminal electrode and said intermediate connection wiring are at least a single-layer film containing one of Al, Al alloy, Ag, and Ag alloy
wherein the line width of said intermediate connection wiring at the end of said first substrate is set to be not greater than 20 µm, and an interval between said adjacent intermediate connection wirings is set to be not less than 40 µm.

3. A liquid crystal display comprising:
a first substrate;
a terminal electrode made of metal, said terminal electrode being disposed on a surface inside said first substrate;
an intermediate connection wiring made of metal, one end of said intermediate connection wiring being connected to said terminal electrode and the other end of said intermediate connection wiring reaching an end of said first substrate;
a second substrate; and
a liquid crystal layer interposed between said first substrate and said second substrate;
wherein a line width of said intermediate connection wiring at the end of said first substrate is set to be narrower than an electrode width of said terminal electrode wherein said intermediate connection wiring is formed for not less than 200 μm from the end of said first substrate to inside the said first substrate wherein the line width of said intermediate connection wiring at the end of said first substrate is set to be not greater than 20 μm, and an interval between adjacent intermediate connection wirings is set to be not less than 40 μm.

4. A liquid crystal display comprising:

a first substrate;

a terminal electrode made of metal, said terminal electrode being disposed on a surface inside said first substrate;

an intermediate connection wiring made of metal, one end of said intermediate connection wiring being connected to said terminal electrode and the other end of said intermediate connection wiring reaching an end of said first substrate;

a second substrate; and a liquid crystal layer interposed between said first substrate and said second substrate;

wherein a line width of said intermediate connection wiring at the end of said first substrate is set to be narrower than an electrode width of said terminal electrode wherein said terminal electrode and said intermediate connection wiring are at least a single-layer film containing one of Al, Al alloy, Ag, and Ag alloy wherein said intermediate connection wiring is formed for not less than 200 μm from the end of said first substrate to inside said first substrate, and wherein the line width of said intermediate connection wiring at the end of said first substrate is set to be not greater than 20 μm, and an interval between said adjacent intermediate connection wirings is set to be not less than 40 μm.

5. A method for manufacturing a liquid crystal display comprising:

forming a plurality of display electrodes and a plurality of terminal electrodes made of metal on a first substrate inside a cut position for cutting and removing a periphery of said first substrate at a later process;

forming common electrode wiring outside said cut position;

forming an intermediate connection wiring made of metal connecting each of said terminal electrodes and said common electrode wiring, said intermediate connection wiring having a line width narrower than a width of said terminal electrodes;

interposing liquid crystal between a second substrate and said first substrate; and cutting and removing said periphery of said first substrate at said cut position, wherein the line width of said intermediate connection wiring at said cut position is set to be not greater than 20 μm, and an interval between said adjacent intermediate connection wirings is set to be not less than 40 μm.

6. A method for manufacturing a liquid crystal display comprising:

forming a plurality of display electrodes and a plurality of terminal electrodes made of metal on a first substrate inside a cut position for cutting and removing a periphery of said first substrate at a later process;

forming common electrode wiring outside said cut position;

forming an intermediate connection wiring made of metal connecting each of said terminal electrodes and said common electrode wiring, said intermediate connection wiring having a line width narrower than a width of said terminal electrodes;

interposing liquid crystal between a second substrate and said first substrate; and cutting and removing said periphery of said first substrate at said cut position wherein said terminal electrode and said intermediate connection wiring are at least a single-layer containing one of Al, Al alloy, Ag, and Ag alloy, and wherein the line width of said intermediate connection wiring at said cut position is set to be not greater than 20 μm, and an interval between said adjacent intermediate connection wirings is set to be not less than 40 μm.

7. A method for manufacturing a liquid crystal display comprising:

forming a plurality of display electrodes and a plurality of terminal electrodes made of metal on a first substrate inside a cut position for cutting and removing a periphery of said first substrate at a later process;

forming common electrode wiring outside said cut position;

forming an intermediate connection wiring made of metal connecting each of said terminal electrodes and said common electrode wiring, said intermediate connection wiring having a line width narrower than a width of said terminal electrodes;

interposing liquid crystal between a second substrate and said first substrate; and cutting and removing said periphery of said first substrate at said cut position wherein said intermediate connection wiring is formed inward for not less than 200 μm from said cut position, and wherein the line width of said intermediate connection wiring at said cut position is set to be not greater than 20 μm, and an interval between said adjacent intermediate connection wirings is set to be not less than 40 μm.

8. A method for manufacturing a liquid crystal display comprising:

forming a plurality of display electrodes and a plurality of terminal electrodes made of metal on a first substrate inside a cut position for cutting and removing a periphery of said first substrate at a later process;

forming common electrode wiring outside said cut position;

forming an intermediate connection wiring made of metal connecting each of said terminal electrodes and said common electrode wiring, said intermediate connection wiring having a line width narrower than a width of said terminal electrodes;

interposing liquid crystal between a second substrate and said first substrate; and cutting and removing said periphery of said first substrate at said cut position wherein said terminal electrode and said intermediate connection wiring are at least a single-layer containing one of Al, Al alloy, Ag, and Ag alloy wherein said intermediate connection wiring is formed inward for not less than 200 μm from said cut position, and wherein the line width of said intermediate connection wiring at said cut position is set to be not greater than 20 μm, and an interval between said adjacent intermediate connection wirings is set to be not less than 40 μm.

9. A liquid crystal display according to claim 1, wherein at least one of said first and second substrates is an active matrix substrate.

10. A liquid crystal display according to claim 2, wherein at least one of said first and second substrates is an active matrix substrate.

11. A liquid crystal display according to claim 3, wherein at least one of said first and second substrates is an active matrix substrate.

12. A liquid crystal display according to claim 4, wherein at least one of said first and second substrates is an active matrix substrate.

13. A liquid crystal display according to claim 5, wherein at least one of said first and second substrates is an active matrix substrate.

14. A liquid crystal display according to claim 6, wherein at least one of said first and second substrates is an active matrix substrate.

15. A liquid crystal display according to claim 7, wherein at least one of said first and second substrates is an active matrix substrate.

16. A liquid crystal display according to claim 8, wherein at least one of said first and second substrates is an active matrix substrate.

* * * * *